United States Patent [19]
Vasudev

[11] Patent Number: 5,474,865
[45] Date of Patent: Dec. 12, 1995

[54] GLOBALLY PLANARIZED BINARY OPTICAL MASK USING BURIED ABSORBERS

[75] Inventor: Prahalad K. Vasudev, Austin, Tex.

[73] Assignee: Sematech, Inc., Austin, Tex.

[21] Appl. No.: 342,940

[22] Filed: Nov. 21, 1994

[51] Int. Cl.$^6$ ............................................. G03F 9/00
[52] U.S. Cl. ..................... 430/5; 430/322; 430/323; 430/324; 430/321
[58] Field of Search ................... 430/5, 322, 323, 430/324, 321; 378/34, 35

[56] References Cited

U.S. PATENT DOCUMENTS

| | | | |
|---|---|---|---|
| 4,414,317 | 11/1983 | Culp et al. | 430/4 |
| 4,434,224 | 2/1984 | Yoshikawa et al. | 430/323 |
| 4,890,309 | 12/1989 | Smith et al. | 378/35 |
| 5,208,125 | 5/1993 | Lowrey et al. | 430/5 |
| 5,217,830 | 6/1993 | Lowrey | 430/5 |
| 5,225,035 | 7/1993 | Rolfson | 156/5 |
| 5,288,569 | 2/1994 | Lin | 430/5 |

OTHER PUBLICATIONS

"Chrome dry etching for photomask fabrication"; W. W. Flack et al.; SPIE vol. 1809, 12th Annual BACUS Symposium (1992); pp. 85–96.

Primary Examiner—S. Rosasco
Attorney, Agent, or Firm—William W. Kidd

[57] ABSTRACT

A globally planarized binary optical mask has absorbers embedded (buried) in the mask substrate, instead of on the surface of the mask. Light scattering at rough vertical edges of absorbers of prior art masks are reduced or eliminated. Also, due to the buried nature of the absorbers, a triple singularity point encountered in prior art masks at the interface of three environments of quartz, absorber and air, no longer exists. The buried absorbers have an offset distance from the surface of the substrate so that with a minimum effective offset distance, defects and contaminants at the surface of the mask are no longer in the image plane, wherein alleviating a need for a pellicle to protect the mask surface. By reducing light scattering and distortion, the mask of the present invention allows for conventional optical lithography to be extended to ranges of shorter wavelength.

20 Claims, 6 Drawing Sheets

GLOBALLY PLANARIZED BINARY OPTICAL MASK USING BURIED ABSORBERS

BACKGROUND OF THE INVENTION

1. Field of the Invention

The present invention relates to the field of fabricating photomasks for use in the manufacture of semiconductor devices and, more particularly, to the fabrication of binary optical photomasks for use in lithography.

2. Related Application

This application is related to copending application entitled "Attenuated Phase Shifting Mask With Buried Absorbers," Ser. No. 08/342,939, filed Nov. 21, 1994.

3. Prior Art

Conventional binary intensity masks generally contain patterned absorber films (such as chromium, chromium oxide or molybdenum) on a highly polished quartz substrate. These absorber regions on the photomask absorb light so as to totally absorb or significantly attenuate light passing through the region. Thus, dark and light image patterns are projected from the mask onto a target, such as a semiconductor wafer.

The absorber regions are formed on a surface of the quartz so as to present topographical features on the surface. The absorber features can have "rough" edges, as well as other topographical defects, such as cracking or peeling, which can contribute to light scattering at the vertical edges of the absorber. The interface of quartz, absorber material and air form a "triple" optical singularity point due to the intersection of three different indices of refraction.

Additionally, pellicles are used on prior art masks to protect the surface of the mask from being contaminated. This covering is necessary since the image plane is at the surface of the quartz. The attachment of a pellicle in a defect free manner is difficult and involves an expensive manufacturing process. Often, pellicles degrade under exposure to ultraviolet radiation, thereby limiting the useful life of the mask.

Because of these shortcomings, conventional binary optical masks have disadvantages affecting the cost of manufacture and useful life. However, these disadvantages are minimal compared to the "blurring" of the image experienced due to edge diffraction effects and the imperfect edge definition associated with the absorber regions. Without a sharp transition from dark to light, clear distinctive features are difficult to obtain and such distortions are amplified as device features shrink in size. At submicron levels, these edge distortions severely impact image contrast and resolution.

The present invention describes a photomask which addresses the disadvantageous qualities of the conventional binary intensity mask noted above by providing for a photomask having buried absorbers with a built-in offset that significantly reduces edge diffraction effects and eliminates the need for a pellicle.

SUMMARY OF THE INVENTION

A globally planarized binary optical mask using buried absorbers and methods for manufacturing such masks are described. The mask of the present invention utilizes buried absorber regions offset from the surface by a known distance, wherein absorbers for the mask are embedded in the mask substrate and are not formed on the surface of the mask. Light scattering at rough vertical edges of absorbers of prior art masks are reduced or eliminated with the mask of the present invention since much of the scattering is reflected back in to the substrate and are not projected onto the image.

Also, due to the buried nature of the absorbers, a triple singularity point encountered in prior art masks at the interface of three environments of quartz, absorber and air, no longer exists. The buried absorbers have an offset distance from the surface of the substrate greater than the maximum depth of focus (DOF) of the exposure system. With such an effective offset distance, defects and contaminants at the surface of the mask are no longer in the image plane, wherein alleviating a need for a pellicle to protect the mask surface.

By reducing light scattering and distortion, the mask of the present invention allows for conventional optical lithography to be extended to ranges of shorter wavelength without the necessity of developing special pellicles for each wavelength. The reduction of edge scattering also provides for sharper edge definition which translates into improved image patterns.

Methods are described for fabricating masks of the present invention. In one method, trenches are formed in a quartz substrate and filled with an absorber material. After planarization, a dielectric layer is formed over the surface of the mask and the filled trenches or another quartz layer is bonded over it and then etched back. The thickness of the trench determines the thickness of the absorber region and the thickness of the overlying layer determines the offset distance of the absorber region from the surface of the mask.

In an alternative method, a portion of a substrate surface is exposed by an overlying patterned oxide layer. Subsequently, ions are implanted into the exposed regions to form absorber regions within the substrate at a specified depth. The dosage of the ions determines the thickness of the absorber regions and the implantation energy determines the depth, which corresponds to the offset distance of the absorber region from the surface.

Economic Advantage: By enhancing photomasks to permit the use of optical lithography at shorter wavelengths, new lithography techniques and tools need not be utilized for producing semiconductor devices having smaller-dimensioned features.

DETAILED DESCRIPTION OF THE PREFERRED EMBODIMENTS

A globally planarized binary optical mask, having buried absorbers offset from the surface of the mask by a fixed distance, for use in submicron optical lithography to fabricate semiconductor devices is described. In the following description, numerous specific details are set forth, such as specific structures, processes, chemical compositions, etc., in order to provide a thorough understanding of the present invention. However, it will be obvious to one skilled in the art that the present invention may be practiced without these specific details. In other instances, well known processes and structures have not been described in detail in order not to unnecessarily obscure the present invention.

PRIOR ART

Figure 1:
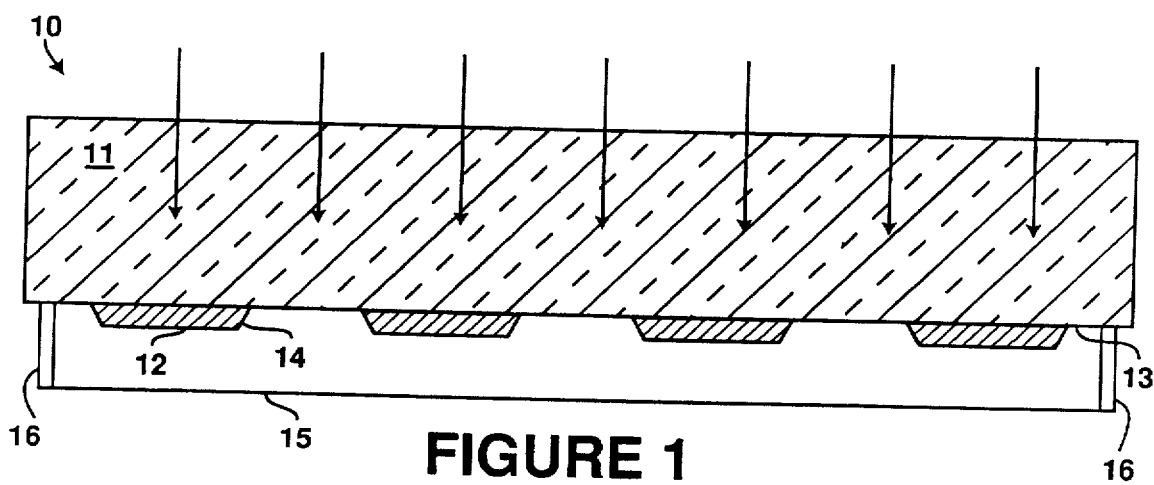
FIG. 1 is a cross-sectional diagram showing a prior art binary optical mask, having light absorbers on its surface and with a pellicle covering the surface of the mask.

Referring to FIG. 1, a typical conventional binary mask 10 is shown having a quartz substrate (mask "blank") 11 containing a patterned feature 12 of metallic absorber film formed on its surface 13. The purpose of the patterned absorber 12 is to absorb light in order for the mask 10 to project a pattern on a target specimen, such as a semiconductor substrate. Although not limited to these, examples of absorber materials are chromium, chromium oxide and molybdenum. The quartz substrate 11 is usually a highly polished quartz having an approximate thickness of 90–250 mils. The absorber 12 areas are typically formed by conventional electron beam (e-beam) lithography and subsequent wet etching.

Vertical edges 14 of the absorber 12 are typically non-specular and present a "rough" surface, resulting from the limitations imposed by the wet etch process. The non-specular surface of the edge 14 contributes to a scattering of projected light, which is an undesirable property for a mask (see for example, "Chrome dry etching for photomask fabrication;" W. W. Flack et al., SPIE Vol. 1809, 12th Annual BACUS Symposium 1992, pp. 85–96.) Also, the limitations of the wet etch process usually will form a sloped edge surface (deviation from the 90 degree wall angle) which limits the minimum useful feature size being imaged. Furthermore, since chromium has a weak absorption property and requires relatively thick films for sufficient absorption, films in the order of $\lambda/4$ to $\lambda/2$ are required for chromium absorbers. Such thick films can place topographic constraints on the size of the absorbers disposed on the mask surface and can lead to more severe edge effects.

Another shortcoming of the prior art binary mask 10 is illustrated in FIG. 1. With the conventional binary intensity mask 10, a pellicle 15 is generally utilized to protect the surface of the mask 10. Since the image plane of the mask is set at the position of the quartz surface and the absorbers 12, defects and contaminants at the surface of the mask will be imaged. Thus, a pellicle is essential in order to maintain the surface 13 of the mask 10 free of contaminants. The pellicle 15 is typically constructed from a thin polymeric membrane and is disposed above the mask image plane by quartz spacers 16. The pellicle 15 prevents surface defects and particulates from being imaged onto the wafer. The attachment of the pellicle 15 in a defect free manner is generally a complex and expensive process requiring specialized equipment and must be performed without introducing defects. In addition, the pellicle 15 material, which is specific for each wavelength used, often undergoes degradation under prolonged exposure to ultraviolet or deep ultraviolet (DUV) wavelengths, thereby reducing the useful life of the mask 10. Ultimately, manufacturing yield losses can be (and generally are) experienced due to the use of pellicle 15.

Figure 2:
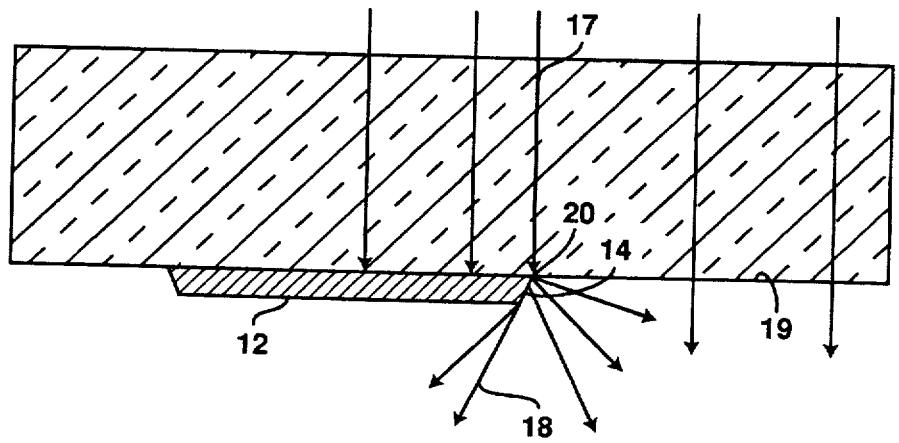
FIG. 2 is a cross-sectional diagram showing a single enlarged light absorber of FIG. 1.

Referring to FIG. 2, a portion of a single absorber 12 is shown highlighting edge effects experienced along the edge 14. Specifically, effects of edge scattering are noted at edge 14. Light rays 17 which transition through the quartz substrate 11 are not interrupted along open (non-absorber) areas 19 of the mask 10. Light rays 17 impinging on the absorbers 12 are absorbed or at least attenuated. The absorbers either completely absorbs the light rays 17 or severely attenuates them, so that very little light (if any) passes through them to reach the target. These light and dark areas form the pattern for the mask.

It is noted that a significant problem is encountered at the edges 14 of absorbers 12. The "rough" sidewall, a result of a wet etch process, and the non-vertical profile of the edge 14 cause a scattering (diffraction) of light, which is illustrated by rays 18 in FIG. 2. This scattering results in a "blurring" of the edge sharpness that can be projected onto the image and can impact the definition of the imaged pattern. Therefore, image contrast and resolution are affected by the scattering experienced at the edge 14.

The scattering is also enhanced due to the intersection of three environments at an intersection point 20. At the point where edge 14 contacts substrate 11, three different environments intersect, each having its own index of refraction. The three different environments are quartz (index of refraction "n" of 1.5), air (n= 1.0) and the absorber (n≈ 2.0 for chromium). The "triple point" optical singularity at point 20 diffracts light and adds to the scattering, thereby degrading the imaging signal-to-noise ratio at the dark-light transition areas of the pattern being projected.

Figure 3:
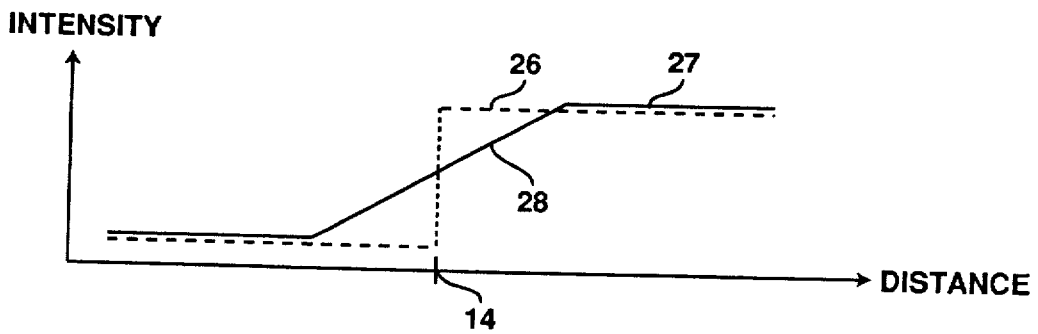
FIG. 3 is a graphical diagram showing light intensity versus distance at an edge of the absorber of FIG. 2, in which ideal and actual transitions from dark to light are compared.

The "blurring" effects are better illustrated in FIG. 3, wherein light intensity projected from the mask 10 onto a target is mapped across the portion of the mask surface shown in FIG. 2. Dotted line 26 illustrates an ideal condition wherein a substantially instantaneous shift (vertical step) from dark to light is preferred at the edge of the absorber. However, in reality solid line 27 exemplifies a typical condition experienced at edge 14 of absorber 12. Due to the scattering and diffraction of light at the edge 14 and point 20, the dark-to-light transition is not as sharp. The "blurring" effect experienced is noted by a sloped profile 28 at the transition from dark to light.

Therefore, it is appreciated that a reduction of the edge scattering would be beneficial for improving the image contrast and resolution. Essentially, it is preferred to increase the slope 28 to make it approach the vertical step noted in the ideal condition exemplified by line 26. Further, it would also be beneficial for improved utilization of the mask, if it did not require the use of a pellicle.

PRESENT INVENTION

Figure 4:
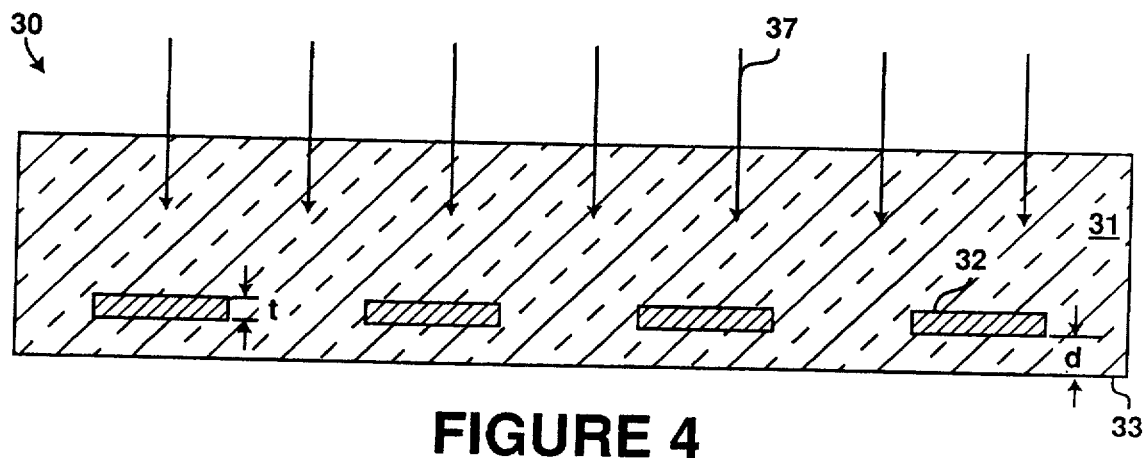
FIG. 4 is a cross-sectional diagram of a buried absorber mask of the present invention.

Referring to FIG. 4, a mask 30 of the present invention is shown. Mask 30 is a globally planarized structure having light absorbers 32 fully embedded (buried) within a highly polished quartz substrate 31. The quartz substrate 31 is equivalent to that of substrate 11 described earlier, however, now the absorbers 32 are disposed completely within substrate 31. Therefore, unlike the prior art mask 10, the absorbers 32 are fully embedded within the quartz 31. Because the absorbers are no longer on the surface of the quartz, the surface 33 of the substrate 31 is essentially flat, thereby allowing for the mask 30 to have a globally planarized surface 33 with no topographical features that can induce diffraction and scattering effects. The pattern formed by the absorbers 32 is equivalent to that of the prior art mask 10, wherein light rays 37 transition through the substrate and are absorbed completely or attenuated by absorbers 32. The absorber material is specifically chosen to have a high extinction coefficient or absorbtivity at relatively small thicknesses. Since the process of forming the absorbers 32 need not involve any wet etch of the absorber material, material other than chrome can be used to form absorbers 32. Materials having much higher absorption properties, such as gold and silicon, are preferred and can be used without manufacturing difficulties.

As noted in FIG. 4, the optical absorbers 32 are offset by a distance "d" from the surface 33. Thickness "t" of the absorbers 32 are also denoted in the Figure. Thickness t and offset distance d are design parameters that are based on the specific material selected for the absorber 32 and the exposure wavelength of the light source. Thus t and d are design parameters and the exact values will depend on the specific application.

For the offset distance d, it will become smaller as the exposure wavelength shortens. For the current generation optical lithography systems, the exposure wavelength resides at visible light (for example, 365 nanometers (nm)) or DUV at 248 and 193 nm. For this range of exposure wavelength, d varies approximately in the range between 0.5 microns (at λ= 193 nm) to 2 microns (at λ= 365 nm). Thus, for DUV systems operating at 248 nm, d will generally fall within the range of 1–2 microns. This distance is greater than the depth of focus of the exposure system. The distance d is calculated from the optical requirement that the maximum scattered beam has an angle of incidence greater than the critical angle θc (shown in FIG. 5) for total internal reflection in the quartz. In addition the distance d must be greater than the maximum depth of focus (DOF) of the exposure system employed.

For thickness t, the material selected for the absorber 32 and the exposure wavelength of the system will determine its value. The absorber thickness t is chosen based on the relationship:

$$I = (I_o)(e^{-\alpha t})$$

where $I_o$ is the incident intensity, $I$ is the transmitted intensity, $\alpha$ is the absorption coefficient for a given material and t is the thickness. The thickness t is chosen so that the transmitted light intensity $I$ is a small fraction (such as, less than 1%) of the incident light intensity $I_o$. This light absorption results in an "optically" dark region on the mask 30.

An important distinction regarding mask 30 is that a pellicle is not needed. The mask 30 does not require a pellicle since the surface defects and contaminants at surface 33 are beyond the maximum depth of focus of the exposure system and, hence, are automatically placed outside of the image plane. Since the image plane is situated at the absorbers 32, the offset distance d functions to isolate the absorbers from any defects or contaminants at the surface 33.

Another important distinction of the buried absorbers 32 is that the surface 33 of the mask 10 can be made globally planar. Since absorbers are not constructed on the outer surface of the mask 10, the outer surface 33 is made planar. Lack of surface topography on a globally planarized surface ensures that topographical effects at the surface do not add to any distortion of the image plane. Thus, there are no scattering or diffraction effects that occur due to topographical effects.

Figure 5:
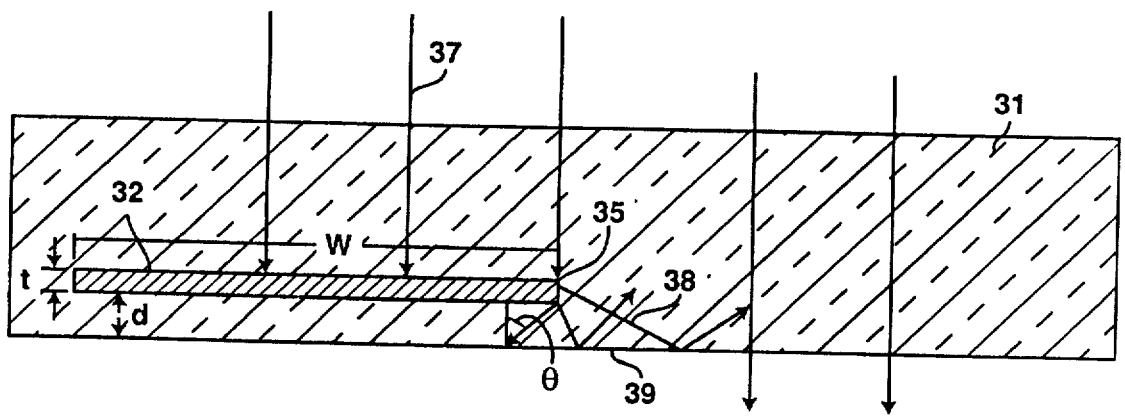
FIG. 5 is a cross-sectional diagram showing a single enlarged light absorber of the present invention of FIG. 4 and a critical angle for reflecting light back into the mask.

Referring to FIG. 5, a portion of a single absorber 32 within substrate 31 is shown. With the mask 30 of the present invention, significantly less light scattering is experienced at the edge 35 of buried absorber 32. As shown in FIG. 5, light scattering is noted by arrows 38. The reduction in the scattering is attributable to the buried disposition of the absorber 32. Since the absorber 32 resides totally within substrate 31, much of the scattering 38 due to the edge effect will be trapped within the substrate 31. Total internal reflection occurs at the quartz-air interface 39, wherein scattered light rays 38 are reflected back into the quartz 31 and are prevented from reaching the target. Additionally, a triple point singularity is not encountered since the absorbers do not come in contact with the air environment. Thus, diffraction and scattering previously encountered at the triple point optical singularity is minimized. The absorber thickness t is minimized by selecting a material with a high absorbtivity (α). The mask manufacturing process is made more independent of the material choice.

Figure 6:
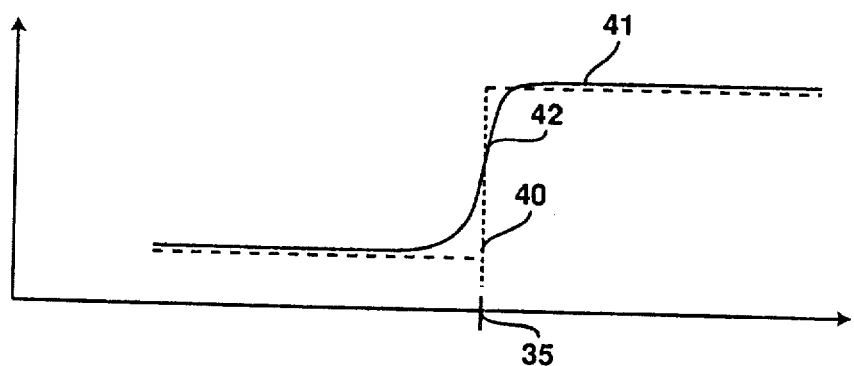
FIG. 6 is a graphical diagram showing light intensity versus distance at an edge of the absorber of FIG. 5, in which ideal and improved transitions from dark to light are compared.

Referring to FIG. 6, an intensity profile for a projected image is shown. Again, an ideal situation for imaging a pattern onto a target is shown by dotted line 40, wherein an ideal transition at edge 35 distinguishes an instantaneous dark-light transition. A solid line 41 shows the intensity pattern when a buried absorber mask 10 of the present invention is used. The vertical transition 42 of the intensity profile 41 approaches the ideal condition of line 40 and is significantly sharper than slope 28 of the prior art mask shown in FIG. 3. The sharpness is due to the reduction of the "blurring" at the edge, which reduction is the result of having the absorber layer buried within quartz 31.

As noted with the prior art mask, materials which are currently utilized for absorbers films can be readily used with the mask of the present invention. Chromium, chromium oxide and molybdenum are examples, but other light absorbing films can be used as well. Generally, metal films are preferred, but other films, such as silicon films can be used as well. The thickness t is calculated equivalently to that of the prior art absorber. The thickness will depend on the material and the exposure wavelength. The offset distance d is calculated as follows. If $\theta c$ (shown in FIG. 5) is the critical angle for total internal reflection (for quartz) and w is the size (width) of the absorber feature, then $d = w/(2 \tan \nu c)$. The critical angle $\theta c$ is dependent on the exposure wavelength and the index of refraction of quartz.

Furthermore, the planar surface of the mask offers a number of advantages. The surface of the mask is free from topographic features and, therefore, reduces or eliminates diffraction and scattering at the surface. The completed mask can be cleaned and used in manufacturing with greater ease as compared to masks with pellicles. The absorber material will have less cracking and peeling due to edge roughness. The same mask can be used at a variety of wavelengths, since the pellicle is not utilized.

Thus, a globally planarized binary optical mask using buried absorbers is described.

METHODS OF FABRICATION

A variety of prior art processes can be adapted to fabricate the buried absorber mask of the present invention. However, novel and preferred methods for manufacturing such masks are described below.

A method for fabricating a mask 31 of the present invention is shown in FIGS. 7–12. Actually there are two methods illustrated in FIGS. 7–12, but the front end of the process as shown in FIGS. 7–11 are similar for both methods. FIG. 12A shows one method of completing the mask from the step described in reference to FIG. 11, while FIG. 12B shows another method of completing the mask from FIG. 11.

Figure 7:
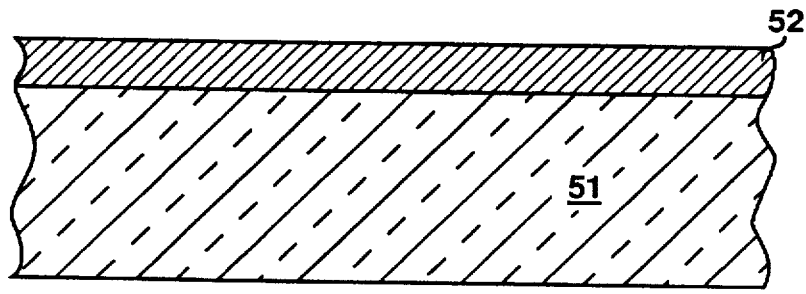
FIG. 7 is a cross-sectional diagram showing a formation of a photoresistive layer on a mask substrate for fabricating a mask of the present invention.
Figure 8:
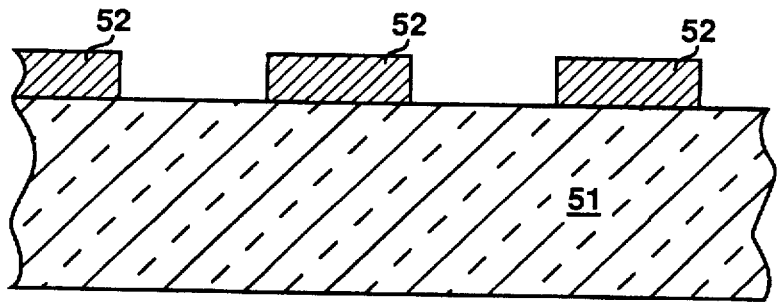
FIG. 8 is a cross-sectional diagram showing a patterning of the photoresistive layer of FIG. 7 to expose portions of the underlying substrate.
Figure 9:
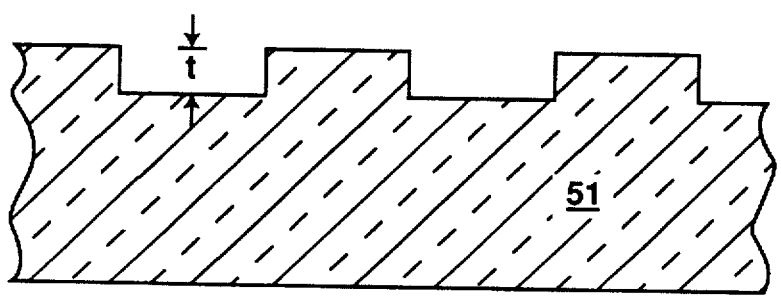
FIG. 9 is a cross-sectional diagram showing the etching of the exposed substrate of FIG. 8 to form trench openings in the substrate.

Referring to FIG. 7, a quartz substrate 51 or mask "blank" is shown having a photoresistive layer 52 formed thereon. The quartz substrate 51 typically has a thickness in the approximate range of 90–250 mils. Quartz substrates currently used as mask blanks for fabricating photomasks can be readily used as substrate 51. It is important to note that the quartz blank used should not contain any chromium or other absorber coating. The photoresistive layer 52 is formed on the substrate 51 by using any number of prior art techniques. The photoresistive layer 52 is then patterned using a conventional optical or electron beam (e-beam) lithography that exposes portions of the photoresistive layer 52. It should be noted that if e-beam lithography is utilized, an anti-static layer may be necessary to prevent charging. The anti-static layer (if used) is placed on the surface of the quartz below the photoresistive layer 52. The result of performing lithographic exposure and development to pattern the photoresistive layer 52 is shown in FIG. 8, in which patterned openings expose portions of quartz 51.

The exposed areas of quartz 51 are then etched to form trenches using a dry etch process, such as a plasma etch process using a fluorine based chemistry, to a depth t which corresponds to the earlier described thickness for the buried absorber. The etch depth will depend on the absorber material that will be used and the wavelength of the exposure tool in which the mask will be used. The etch rate of the quartz is well characterized and, therefore, t can be obtained having a uniformity of 5% or better. Following the quartz etch, the photoresistive layer 52 is removed, leaving the patterned quartz shown in FIG. 9.

Figure 10:
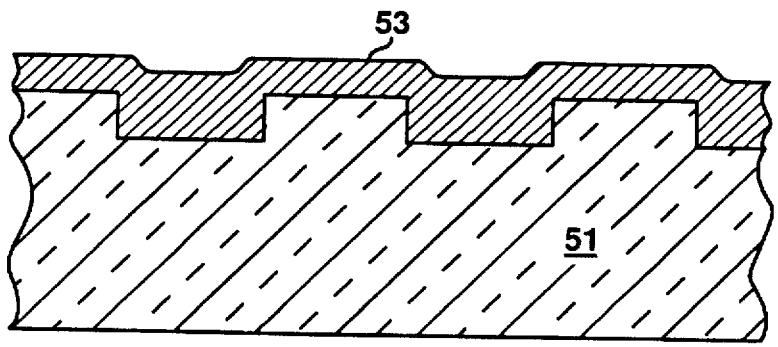
FIG. 10 is a cross-sectional diagram showing a coating of the substrate of FIG. 9 to fill the open trenches of the substrate with a light absorbing material.

Referring to FIG. 10, the patterned quartz substrate is then blanket coated with a selected absorber material 53 utilizing a technique, such as sputtering, evaporation or chemical vapor deposition (CVD). A variety of prior art materials that are known as light absorbers can be utilized for absorber layer 53. More specifically, a number of absorber films are used in the prior art for mask fabrication and these materials can be readily used for layer 53. Although not limited to these, examples of absorber films are chromium, molybdenum, tantalum and silicon. As noted earlier, materials having higher absorbtivity than Cr are preferred in order to reduce the thickness of the absorber layer. A metallic film of high absorbtivity is preferred for the absorber material of the present invention, although silicon can be used if so desired.

Figure 11:
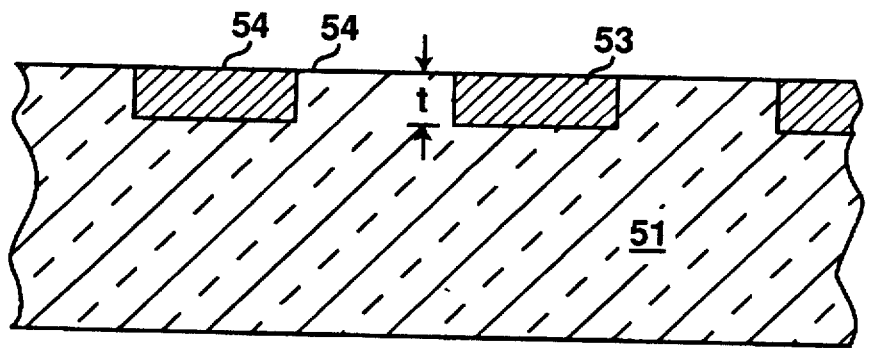
FIG. 11 is a cross-sectional diagram showing the results of etching the surface of the mask of FIG. 10 to have light absorbing material removed from the surface of the substrate, but retaining the absorber material in the trenches.

Subsequently, as shown in FIG. 11, the absorber layer 53 is etched back using a selective etch process. Chemical-mechanical polishing (CMP) is a preferred technique since excellent polish selectivity can be achieved. Since the absorber layer 53 is generally metallic in most instances, high selectivity can be obtained between the metal film 53 and quartz 51. The CMP process can be used to stop on the quartz with good precision. Furthermore, the CMP is also effective in removing particles and other defects, thereby producing a flat (planarized) defect-free surface 54. As shown in FIG. 11, the quartz openings are filled with the absorber material. Next, the quartz substrate is cleaned and processed by one of the following two alternative steps.

Figure 12A:
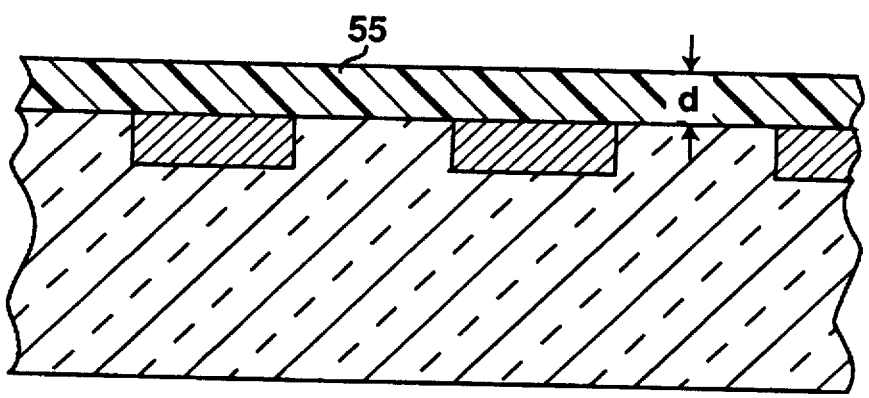
FIG. 12A is a cross-sectional diagram showing a formation of an oxide layer on the surface of the substrate of FIG. 11 to bury the absorber layer.

Referring to FIG. 12A, a dielectric layer 55, such as a $SiO_2$ layer, is deposited over the quartz substrate of FIG. 11. Since layer 55 is deposited on a globally planar surface, it will generally have acceptable thickness uniformity. Layer 55 is deposited to a depth d, which corresponds with the offset distance d of the absorber from the surface of the substrate 51. Any of a well-known prior art techniques, such as a CVD process, can be used to deposit layer 55. The absorber material 53 is now fully encapsulated and has the offset distance d determined by the thickness of the dielectric layer 55.

However, since the CVD deposited dielectric material, even $SiO_2$, will have an index of refraction different than that of quartz, precise matching of layer 55 to quartz may present a problem in some instances. This is particularly true at 193 nm where $SiO_2$ absorbtivity is quite high. Thus, an alternative (and slightly more complicated) process is described in reference to FIG. 12B. In this approach, a quartz plate 58 is bonded on to the quartz substrate 51 of FIG. 11. This second quartz layer 58 should be of sufficient thickness for etch-back. A thickness of approximately 20 mils is sufficient, although the actual thickness is a design choice. Although a variety of techniques could be used to bond quartz layer 58 onto the quartz substrate 51, the preferred step is performed in a rapid thermal processor (RTP) at a temperature of approximately 800 degrees centigrade in a nitrogen ambient. The higher temperature ensures an extremely strong quartz-to-quartz bond and the nitrogen ambient strengthens the bond so that subsequent delamination does not occur.

Figure 12B:
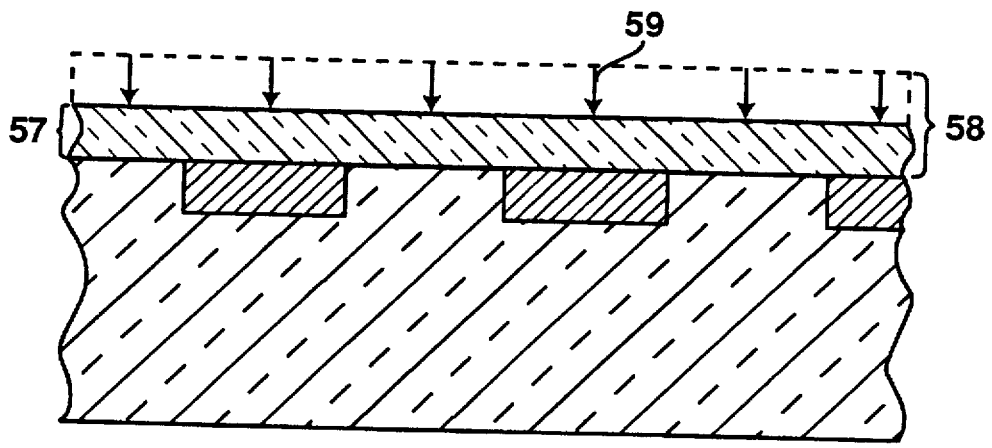
FIG. 12B is a cross-sectional diagram showing a bonding of another layer having the same composition as the substrate on to the surface of the substrate of FIG. 11 to bury the absorber layer and etching back this layer to a specified offset depth.
Figure 13:
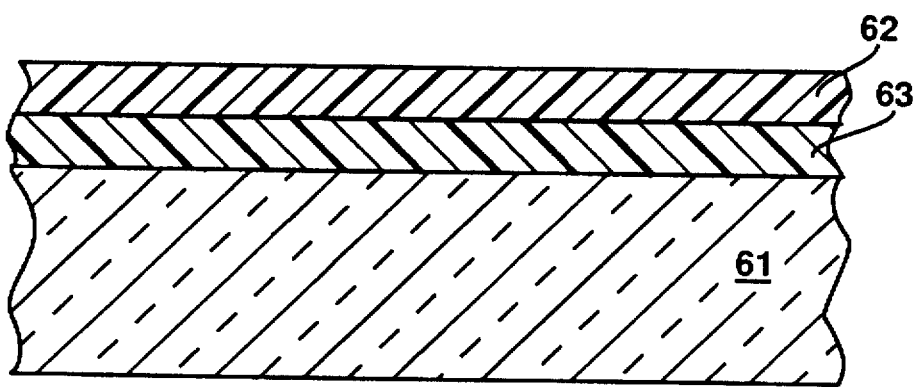
FIG. 13 is a cross-sectional diagram showing a formation of a photoresistive layer above an oxide layer, which is atop a mask substrate, for an alternative method of fabricating a mask of the present invention.

Next the bonded layer 58 is etched back as shown by arrows 59 in FIG. 12B to a thickness 57 of approximately 5000 Å- 5 um. A combination of CMP and chemical etch techniques are used. Initially, bulk of the layer 58 is removed using CMP. Then, a chemical etch (either wet or dry), well-known in the prior art, is used to carefully etch back the remaining quartz until thickness 57 is reached. The chemical etch process will allow for precise control of the etch-back to a final thickness within a tolerance of 5% or less. Thickness 57 is the offset distance d for the absorber 53. The quartz-to-quartz bond results essentially in a single quartz substrate so that this interface does not present a change of the refraction index for the light rays traversing through the quartz.

A completely different and alternative method for fabricating a globally planar, buried absorber mask of the present invention is described in reference to FIGS. 13–16. Instead of forming absorber regions and encapsulating them, this alternative approach utilizes an ion implantation technique to implant metal ions below the surface of the substrate.

Figure 14:
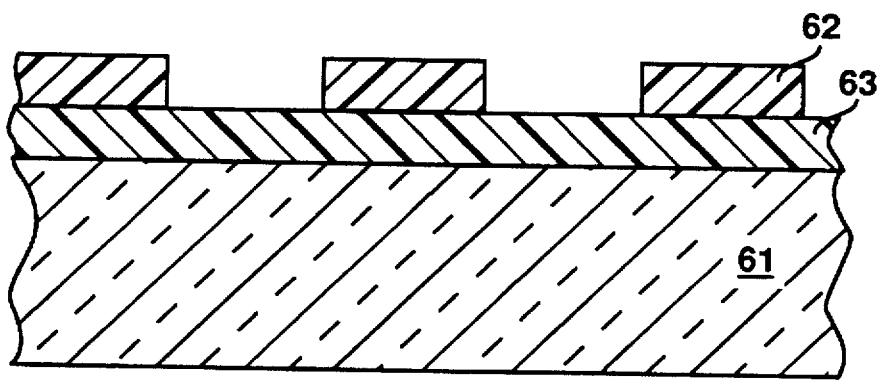
FIG. 14 is a cross-sectional diagram showing a patterning of the photoresistive layer of FIG. 13 to expose portions of the underlying oxide layer.

Referring to FIGS. 13–16, a quartz substrate 61 or mask "blank", equivalent to that of quartz substrate 51, is coated with an oxide layer 63, such as a $SiO_2$ film layer, to a thickness of approximately 1 um using a prior art technique, such as deposition by a CVD process. Next, the $SiO_2$ layer 63 is coated with a photoresistive layer 62 using known techniques for depositing photoresists. The photoresistive layer 62 is then patterned using a known lithographic technique, such as the afore-mentioned e-beam or optical exposure process. After forming the pattern on layer 62, which is shown in FIG. 14, the underlying $SiO_2$ layer 63 is patterned using an etch process, preferably a dry etch process using fluorine based chemistry, to expose portions of quartz substrate 61.

Figure 15:
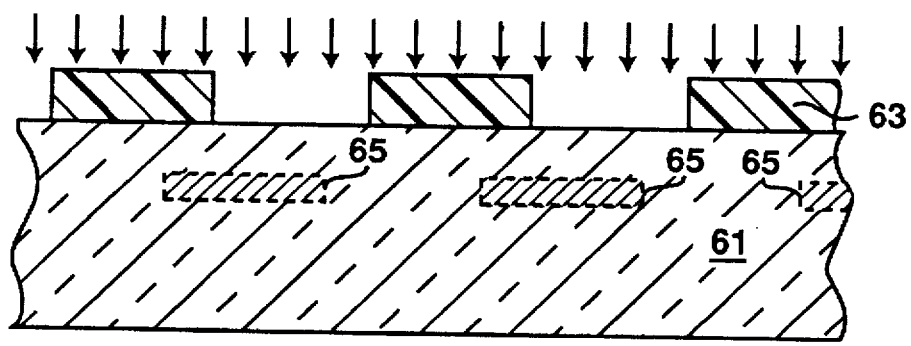
FIG. 15 is a cross-sectional diagram showing results of etching exposed portions of the oxide layer of FIG. 14 to expose portions of the underlying substrate and formation of buried absorber regions by implanting ions into the exposed portions of the substrate.

After patterning the $SiO_2$ layer 63, the photoresistive layer 62 is stripped. Next, the substrate 61 is subjected to an implantation step in which metal ions are implanted into the exposed portions of the quartz 61 by high energy implantation as shown in FIG. 15. The $SiO_2$ functions as a shielding layer so that the implantation occurs only into the exposed quartz. Implantation dosage in the range of $3\times10^{17}/cm^2$–$2\times10^{18}/cm^2$ at energy levels in the range of 1–5 MeV will implant metal ions to a depth ranging from 5000 Å to 2 um. At these dose and energy levels, the metal ions will form a continuous metallic layer 65 in the quartz 61 matrix, wherein layer 65 will have a thickness in the range of 500 Å–800 Å. The actual depth of implantation, as well as the thickness of the implanted layer 65 is a design choice and will be determined by the application of the mask for which it is being fabricated. Furthermore, a variety of metal ions can be used for implantation. Although not limited to these ions, examples of metal ions are chromium ($Cr^+$), gold ($Au^+$), titanium ($Ti^+$) and tantalum ($Ta^+$).

Figure 16:
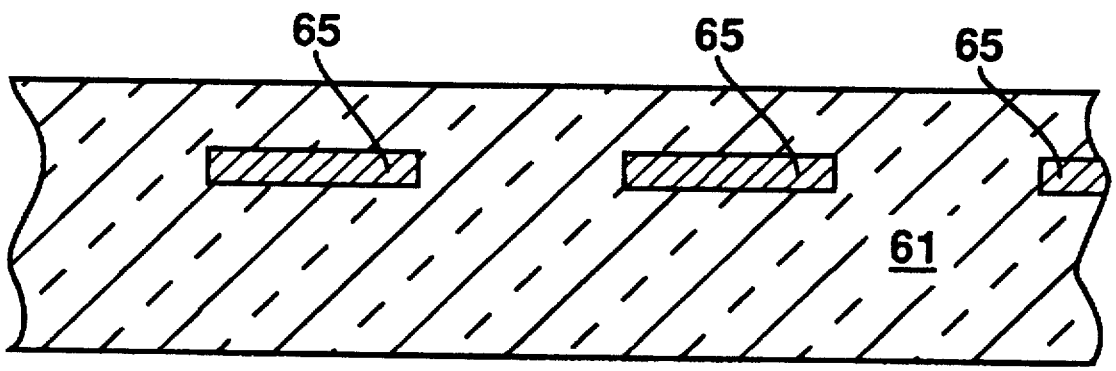
FIG. 16 is a cross-sectional diagram showing the mask with buried absorber regions after the implantation of FIG. 15 and the removal of the oxide layer.

Finally, as is shown in FIG. 16, the remaining $SiO_2$ 63 is stripped and the quartz substrate 61 is annealed at approximately 1000 degrees centigrade to remove any residual implant damage in the quartz 61. The substrate 61 is then cleaned and inspected. The implanted layer 65 is the buried absorber layer of the mask. Thus, the thickness of this layer 65 corresponds to thickness t of the buried absorber and the implant depth corresponds to the offset distance d of the mask. By utilizing this method, absorber thickness t and offset distance d can be tightly controlled.

I claim:

1. A binary optical photolithography mask for use in projecting an image pattern onto a target comprising:

a mask substrate formed from a substantially transparent material for permitting light transmission therethrough;

an absorber pattern formed from a light absorbing material, buried a set distance d below a surface of said substrate proximal to said target but not adjacent to said surface for absorbing at least a significant portion of light transmission therethrough to form a substantially opaque image pattern on said target;

wherein having said absorber pattern buried below said surface of said substrate, but not adjacent to said surface, allows for light scattered from surface areas of said absorber pattern to be reflected back into said substrate at a surface interface of said substrate, in order to improve image feature definition at said target; and wherein having said absorber pattern buried below said surface at said set distance d is of sufficient depth in order to provide for a maximum depth of focus of an exposure system being utilized to reside within said substrate, such that surface defects and contaminants at said surface interface are not imaged onto said target.

2. The mask of claim 1 wherein said surface of said substrate has a substantially planar surface.

3. The mask of claim 2 wherein said light absorbing material is comprised of a metallic film.

4. The mask of claim 3 wherein a thickness t of said absorber pattern is determined by a relationship $I = (Io)(e^{\alpha t})$, where Io is an incident intensity of light of said exposure system being utilized, I is a desired fraction of said incident intensity to be transmitted through said absorber pattern and a is an absorption coefficient for said light absorbing material.

5. The mask of claim 5 wherein said set distance d for said absorber pattern is determined by a relationship $d = w/(2 \tan \theta c)$, where $\theta c$ is a critical angle for total internal reflection for said mask substrate and w is a width of a feature of said absorber pattern.

6. The mask of claim 6 wherein said mask substrate is made from quartz.

7. A method of fabricating a binary optical photolithography mask for use in projecting an image onto a target, comprising the steps of:

forming a photoresistive layer over a mask substrate;

patterning said photoresistive layer to expose portions of said substrate underlying said photoresistive layer;

etching said exposed portions of said substrate to a predefined depth to form trenches in said substrate;

removing remaining portions of said photoresistive layer;

depositing a layer of light absorbing material over said substrate and filling said trenches;

selectively etching back said layer of light absorbing material until only said trenches are filled with said light absorbing material;

forming a dielectric layer of a predefined thickness over said substrate and said trenches to form an upper boundary region of said mask in order to bury said light absorbing material below a surface of said mask now formed by exposed surface of said dielectric layer;

wherein said absorbing material forms an absorber pattern below said surface of said substrate but not adjacent to said surface, such that light scattered from surface areas of said absorber pattern are reflected back into said substrate at a surface interface of said substrate, in order to improve image feature definition at said target; and wherein having said absorber pattern buried below said surface at a depth d, determined by said predefined thickness of said dielectric layer, is of sufficient depth in order to provide for a maximum depth of focus of an exposure system being utilized to reside within said substrate, such that surface defects and contaminants at said surface interface are not imaged.

8. The method of claim 7 wherein said step of forming said dielectric layer over said substrate and said trenches forms a substantially planar surface at said exposed surface of said dielectric layer.

9. The method of claim 8 wherein said step of selectively etching back said layer of light absorbing material is performed by a chemical-mechanical polishing process.

10. The method of claim 9 wherein a thickness t of said absorber pattern is determined by a relationship $I = (Io)(e^{-\alpha t})$, wherein Io is an incident intensity of light of said exposure system being utilized, I is a desired fraction of said incident intensity to be transmitted through said absorber pattern and $\alpha$ is an absorption coefficient for said light absorbing material.

11. The method of claim 10 wherein said depth of said absorber pattern below said surface of said dielectric layer is determined by a relationship $d = w/(2 \tan \theta c)$, where $\theta c$ is a critical angle for total internal reflection for said mask substrate and w is a width of a feature said absorber pattern.

12. The method of claim 11 wherein said step of forming said dielectric layer is comprised of depositing an oxide layer of said predefined thickness.

13. The method of claim 12 wherein said mask substrate is made from quartz.

14. The method of claim 11 wherein said mask substrate is made from quartz and said step of forming said dielectric layer is comprised of bonding a quartz layer, having a thickness greater than said predefined thickness, onto said quartz substrate and etching back said quartz layer to said predefined thickness.

15. A method of fabricating a binary optical photolithography mask for use in projecting an image onto a target, comprising the steps of:

forming an oxide layer over a mask substrate;

forming a photoresistive layer over said oxide layer;

patterning said photoresistive layer to expose portions of said oxide layer underlying said photoresistive layer;

etching said exposed portions of said oxide layer to expose portions of said underlying substrate;

removing remaining portions of said photoresistive layer, but leaving patterned portions of said oxide layer;

implanting doped ions into exposed portions of said substrate to a set depth d below exposed surface of said substrate to form patterned light absorbing regions in said substrate but not adjacent to said surface;

removing remaining portion of said oxide layer such that said substrate has a substantially planar surface with buried light absorbing regions below surface of said substrate;

wherein said buried absorbing regions allow for light scattered from surface areas of said absorbing regions to be reflected back into said substrate at a surface interface of said substrate, in order to improve image feature definition at said target; and wherein having said patterned absorbing regions buried below said surface at said depth d is of sufficient depth in order to provide for a maximum depth of focus of an exposure system being utilized to reside within said substrate, such that surface defects and contaminants at said surface interface are not imaged.

16. The method of claim 15 wherein thickness of said light absorbing regions in said step of implanting doped ions is determined by dosage of said doped ions implanted into said substrate.

17. The method of claim 16 wherein said set depth d of implanting doped ions is determined by an amount of implanting energy imparted on said ions during said step of implanting them.

18. The method of claim 17 wherein said dosage for implantation is in an approximate range of $3 \times 10^{17}/cm^2 - 2 \times 10^{18}/cm^2$.

19. The method of claim 18 wherein said implanting energy is in an approximate range of 1–5 million electron volts.

20. The method of claim 19 wherein said mask substrate is made from quartz.

* * * * *

UNITED STATES PATENT AND TRADEMARK OFFICE
CERTIFICATE OF CORRECTION

PATENT NO. : 5,474,865
DATED : December 12, 1995
INVENTOR(S) : Prahalad K. Vasudev It is certified that error appears in the above-indentified patent and that said Letters Patent is hereby corrected as shown below:

Column 6, line 18, "1" should be --I--.

Column 6, line 21, "1" should be --I--.

Column 7, line 19, "vc" should be --θc--.

Column 10, line 26, "I=(Io)(e$^{\alpha}$) should be --I=(Io)(e$^{-\alpha t}$)--.

Column 10, line 30, "a" should be --α--.

Column 10, lines 33 and 34, "d=w/(2tan vc)" should be --d=w/(2tan θc)--.

Column 11, lines 15 and 16, "I=(Io)(e-αt)" should be --I=(Io)(e$^{-\alpha t}$)--.

Signed and Sealed this

Twenty-ninth Day of July, 1997

*Attest:*

BRUCE LEHMAN

*Attesting Officer*   *Commissioner of Patents and Trademarks*